(12) United States Patent  
Railkar et al.

(10) Patent No.: US 7,112,545 B1
(45) Date of Patent: Sep. 26, 2006

(54) PASSIVATION OF MATERIAL USING ULTRA-FAST PULSED LASER

(75) Inventors: Tarak A. Railkar, Irvine, CA (US); Ajay P. Malshe, Fayetteville, AR (US); William D. Brown, Fayetteville, AR (US)

(73) Assignee: The Board of Trustees of the University of Arkansas, Fayetteville, AR (US)

( * ) Notice: Subject to any disclaimer, the term of this patent is extended or adjusted under 35 U.S.C. 154(b) by 326 days.

(21) Appl. No.: 10/069,768

(22) PCT Filed: Sep. 11, 2000

(86) PCT No.: PCT/US00/24837

§ 371 (c)(1),
(2), (4) Date: Jul. 8, 2002

(87) PCT Pub. No.: WO01/18852

PCT Pub. Date: Mar. 15, 2001

Related U.S. Application Data (60) Provisional application No. 60/153,069, filed on Sep. 10, 1999.

(51) Int. Cl.
*H01L 21/26* (2006.01)

(52) U.S. Cl. .................. 438/795; 438/38; 438/473; 438/958; 438/974; 257/56; 257/58; 257/62; 257/626; 257/E21.002

(58) Field of Classification Search .............. 438/38, 438/473, 795, 958, 974; 257/56, 58, 62, 257/626
See application file for complete search history.

(56) References Cited

U.S. PATENT DOCUMENTS

| 4,406,053 | A | | 9/1983 | Takasaki et al. .............. 29/588 |
| 5,139,606 | A | | 8/1992 | Maki .......................... 156/643 |
| 5,352,330 | A | | 10/1994 | Wallace ...................... 156/643 |
| 5,665,637 | A | | 9/1997 | Chand .......................... 372/46 |
| 5,736,709 | A | | 4/1998 | Neiheisel .................. 219/121.61 |
| 5,780,120 | A | * | 7/1998 | Belouet et al. .............. 427/554 |
| 6,008,525 | A | | 12/1999 | Barron et al. ............... 257/629 |
| 6,159,620 | A | * | 12/2000 | Heath et al. ................. 428/615 |
| 6,585,947 | B1 | * | 7/2003 | Nayfeh et al. .............. 423/348 |

FOREIGN PATENT DOCUMENTS

JP   63-102918   5/1988

OTHER PUBLICATIONS

Parker et al., "Deposition of passivated gold nanoclusters onto prepatterned substrates", Applied Physics Letters, vol. 74, No. 19, pp. 2833-2835, May 10, 1999.*

N.C. Tien et al., "Surface adhesion reduction in silicon microstructures using femtosecond laser pulses", *Appl. Phys. Lett.*, 68 (2), Jan. 8, 1996, pp. 197-199.

* cited by examiner

*Primary Examiner*—Zandra V. Smith
*Assistant Examiner*—Christy Novacek
(74) *Attorney, Agent, or Firm*—Miles & Stockbridge PC (57) ABSTRACT

The surface of a semiconductor material, e.g., gallium arsenide, is passivated by irradiating the surface with ultrashort laser pulses, until a stable passive surface is achieved. The passive surface so prepared is devoid of a superficial oxide layer.

15 Claims, 11 Drawing Sheets

PASSIVATION OF MATERIAL USING ULTRA-FAST PULSED LASER

CROSS-REFERENCE TO RELATED APPLICATION

This application claims the benefit of the priority of U.S. Provisional Application No. 60/153,069, filed Sep. 10, 1999, the entire disclosure of which is incorporated herein by reference.

BACKGROUND OF THE INVENTION

1. Field of the Invention

This invention relates to forming passivated surfaces on solid materials and more particularly to formation of passivated surfaces on semiconductor materials by laser irradiation.

2. Brief Description of the Prior Art

The design and manufacture of semiconductor devices is based on the electronic properties of the bulk semiconductor material of which they are made. The bulk material is ordinarily a single crystal having a uniform lattice structure and containing various dopants, which introduce the impurity levels required to provide the desired electrical conduction properties. Within the bulk crystal each atom is bound to its neighbors in the lattice. However, at the surface of the crystal the regular lattice is interrupted. Accordingly the atoms at the surface of the crystal exhibit dangling bonds, not used to join neighboring atoms, but available to react with other materials in the environment, e.g., oxygen, to introduce surface energy levels or states that may change or interfere with the electrical properties of the device. In order to prevent such degradation of the properties of the semiconductor device, a passivating layer is customarily applied to the surface of the crystal in order to tie up any dangling bonds and thereby stabilize the surface against any further degradation.

In the case of silicon, which has been the material of choice for a wide variety of electronic applications for almost four decades, the surface is easily passivated by formation thereon of a stable adherent layer of silicon dioxide. The passivating oxide layer can be formed by conventional techniques such as thermal oxidation of the surface or chemical vapor deposition (CVD). This stable surface chemistry of silicon, as well its low cost, easy availability, and mature processing technology, has favored the wide use of silicon as the substrate material in the manufacture of semiconductor devices. However, silicon also has certain limitations, particularly in the field of wireless communications, especially as higher frequencies have come into use. Because silicon has an indirect band gap structure, it is less efficient for applications involving radio-frequency (RF) and wireless communications. Consequently, other semiconductor materials, especially those possessing a direct band gap (i.e., those materials wherein the valence band energy maxima and conduction band energy minima occur at the same k value in the E-k space) have come to be used for such applications.

Among the direct-band gap semiconductors, gallium arsenide (GaAs), a III–V compound semiconductor, has come to be widely used. As a direct consequence of the direct band gap, together with a higher band gap energy (1.42 eV for GaAs, versus 1.1 eV for Si) GaAs supports high frequency device applications, such as cellular (e.g., cellular telephones (cell phones)) and other wireless communication equipment, whereas silicon cannot. Consequently, GaAs semiconductor devices, although generally more expensive, have found a commercially valuable niche where silicon cannot effectively compete.

However, manufacture of semiconductor devices from GaAs also faces some challenges. Most importantly, unlike Si, GaAs does not form a natural and stable protective passivating layer. Consequently, it has been difficult to design and manufacture metal-oxide-semiconductor (MOS) devices using GaAs. Furthermore, the oxides of gallium and arsenic are somewhat volatile, with the result that they may escape from the surface after they are formed, causing further depletion of their respective atoms with time. Since the electronic properties of GaAs depend on the stoichiometric ratio of Ga to As atoms, such an uncontrolled oxidation degrades the electronic performance of devices fabricated on GaAs wafers. To overcome this problem, passivation of the surface is conventionally achieved by treating the surface with a protective overlayer, generally an organic polymer. Although the passivating overlayer protects the surface, and hence stabilizes the electronic properties of the GaAs, it also introduces an undesirable feature because it entails a higher cost for controlling the electronic properties of the device.

Accordingly, a need has continued to exist for a method of preparing a stable passive surface on gallium arsenide wafers and the like used in manufacturing semiconductor devices.

SUMMARY OF THE INVENTION

The problem of passivating the surface of a semiconductor substrate, such as gallium arsenide and the like, has now been alleviated by the process of the invention wherein the surface of a substrate material is irradiated with one or more ultra short laser pulses until a stable passive surface is achieved. The invention also embraces a passive surface prepared by the process of the invention, and a passive surface having nanoclusters of atoms distributed thereon.

Accordingly, it is an object of the invention to provide a passive surface on a solid semiconductor substrate.

A further object is to provide a method for forming a passive surface on a semiconductor substrate.

A further object is to provide a method for forming a passive surface on gallium arsenide.

A further object is to provide a semiconductor having a passive surface.

A further object is to provide solid gallium arsenide having a passive surface.

Further objects of the invention will become apparent form the description of the invention which follows.

DETAILED DESCRIPTION OF THE INVENTION AND PREFERRED EMBODIMENTS

According to the invention the surface of a material to be passivated may be treated with pulses of electromagnetic radiation of duration sufficiently limited so that the entire energy of the pulse is concentrated at the surface. This concentration is typically achieved by irradiating the substrate material with pulses that are no longer than the period of atomic vibrations of the material. These atomic vibrations typically have a period of the order of $10^{-11}$ seconds at room temperature (about 300° K). Pulses of radiation useful in practicing the process of the invention are conveniently generated by a laser operated in a mode to provide a train of pulses of appropriately short duration. The surface is typically exposed to the pulsed laser beam for a period of time until the surface has been rendered passive, i.e., will not react with atmospheric oxygen at ordinary room temperature at any significant rate. Such a passive surface will retain its properties stably for an indefinite period of time at room temperature. Ordinarily such a surface is considered to be passivated if it undergoes no significant reaction with atmospheric oxygen for a period of several weeks, i.e., exhibits no or substantially no change in its surface characteristics or properties over such a period of time. However, it is also according to the invention to prepare a passive surface that does not undergo any significant change in its properties when exposed to atmospheric air for a period of time that is useful for preparing the substrate for further treatments and/or manufacturing operations.

It is believed that the use of extremely short pulses of electromagnetic radiation provides an effect that is confined primarily to the surface atoms only, because most of the energy deposited by the pulse cannot be transferred to the atoms lying below the semiconductor surface. Consequently, the duration of the laser pulse is preferably limited so that no substantial fraction of the energy deposited in the surface atoms is dissipated by being conducted to atoms lying below or beside the surface atoms. Accordingly, the pulse is preferably limited to be no longer than is needed to produce its surface passivating effect. The skilled practitioner will understand that the transfer of energy from surface atoms to those lying deeper or surrounding the material is a rate process, and that the energy transfer will gradually begin to occur as the pulses are made longer. Consequently, determining the maximum pulse duration that provides a useful passivating effect without causing undesirable heating of the bulk material may require some preliminary experimentation. However, it is according to the invention to form a passive surface on a substrate material, particularly a semiconductor material, by treating the surface with pulsed electromagnetic radiation wherein the pulse duration is controlled so that the effect of the treatment is confined substantially to the surface of the substrate.

Typically the pulse duration of the radiation will be less than period of the atomic vibrations of the substrate, as pointed out above, i.e., less than about $10^{-11}$ seconds. Preferably the pulse duration should be no greater than about $10^{-12}$ seconds, i.e., 1 picosecond or 1000 femtoseconds. More preferably the pulse duration should be no greater than about 500 femtoseconds. Lasers producing pulses having a duration that is conveniently described in terms of femtoseconds (i.e., a duration less than one picosecond) are often termed femtosecond lasers. There is no lower limit to the pulse duration that is useful in preparing passive surfaces by the process of the invention. However, the skilled practitioner will recognize that enough energy must be supplied in a laser pulse to effect the changes in surface structure that are necessary to produce a passive surface. Consequently, the choice of pulse duration and intensity will be made by the practitioner guided by the teaching of this specification.

For passivation of an n(100) GaRs surface it has been found that irradiation with a few hundred laser pulses having an energy density of about 1.3 millijoules per square centimeter ($mJ/cm^2$) will remove the naturally occurring oxide layer and form a passive surface. The skilled practitioner will recognize that the total number of pulses needed to achieve a passive surface devoid of extraneous materials such as oxides will depend on the energy of the pulses and the degree of contamination on the surface before treatment, as well as the material of the substrate having the surface to be treated. Accordingly, the energy density of the individual ultra-short pulses may vary from about 0.01 $mJ/cm^2$ to about 100 $mJ/cm^2$. The number of pulses may vary from relatively few, e.g., 10 pulses, or even less if very energetic pulses are used, to several thousand pulses. Treatments are conveniently performed and controlled when a pulse energy level is selected that produces the desired passivation effect using a number of pulses in the range of from about 50 pulses to about 2000 pulses, preferably from about 100 pulses to about 1000 pulses.

Although any procedure or equipment may be used to produce the ultra-short pulses of radiation used in the method of the invention, such pulses are currently most conveniently produced using a pulsed laser operating in a mode that produces a train of ultra-short pulses, preferably pulses having a duration less than about 1 picosecond, i.e., a femtosecond laser. Such lasers can emit radiation having from about 1 pulse per second to several thousand pulses per second, e.g., about 10,000 pulses per second or more. At such conventional pulse rates, re-formation of the surface oxide between pulses does not ordinarily occur to any significant extent. Nevertheless, it is according to the invention to use any pulse rate that produces a net removal of native surface oxide and passivation of the underlying surface of the semiconductor material. Evidently, the total energy that the laser pulse train has to deliver in order to achieve a passivated surface will depend on the initial condition of the surface to be treated, e.g., the thickness of an oxide layer or the like, and the chemical composition of the material to be treated. This energy can be delivered by any feasible arrangement of pulse duration, pulse intensity and pulse frequency. The laser beam may be focused or unfocused as convenient for providing the required energy density on the surface of the material to be passivated. The practitioner will adapt the available equipment to the needs of a particular material to achieve a satisfactory passivated surface.

The energy density of the beam is applied repeatedly to a given area of the semiconductor surface to produce the desired passivating effect. If a surface having an area larger than the effective cross-sectional area of the beam is to be treated, the beam can be scanned over the surface area. Each portion of the surface area may be passivated by the process of the invention, either sequentially or by repeated scanning of the surface.

It will also be recognized by the practitioner that the wavelength of the laser radiation used in the process of the invention is preferably chosen to be absorbed by the surface atoms of the substrate and not to penetrate substantially into the bulk of the substrate. In general lasers emitting radiation in the range from the near infra-red region of the spectrum to the far ultra-violet region are useful in the process of the invention. Accordingly lasers emitting at wavelengths in the range from about 2 micrometers to about 50 nanometers are most useful. However, the practitioner will adapt the laser wavelength to the absorption spectrum of the substrate to insure that the radiation is absorbed by the surface atoms thereof.

The process of the invention is particularly useful in preparing passive surfaces on semiconductor materials, especially those, such as gallium arsenide, that do not form stable adherent surface oxide layers.

The surface of a gallium arsenide wafer, as prepared by the conventional synthesis of single-crystal GaAs and subsequent cutting and finishing of the wafer surface, will, in general, have numerous dangling bonds, i.e., electronic orbitals that are directed generally outward with respect to the bulk material and are not satisfied by bonding to other atoms. The bonds react relatively rapidly with any reactive material that contacts the surface. In particular, a gallium arsenide, or other semiconductor, surface having such dangling bonds will rapidly accumulate an oxide layer formed by reaction with atmospheric oxygen. However, as discussed above, this oxide layer is not a stable protective layer for GaAs such as that formed on silicon. Accordingly, in order to prepare a passive surface according to the invention, it is desirable to remove the oxide layer and form a surface wherein the bonds of the surface atoms are redirected toward neighboring surface atoms.

The invention will be illustrated by the following example, which is provided for illustrative purposes only, and is not intended to limit the scope of the claims.

EXAMPLE

This example illustrates the treatment of a gallium arsenide surface to remove the naturally existing surface oxide and prepare a stable passive surface.

Samples of n(100) GaAs, 600 micrometers thick, were prepared. Each sample was about 1 cm×1 cm in dimensions, and was degreased by treating it with warm methanol for about two minutes. The samples were then rinsed in flowing de-ionized water and dried in flowing nitrogen gas. The cleaned GaAs samples were mounted vertically on a computer controlled X-Y-Z translation stage.

The samples were then treated with an unfocussed femtosecond laser beam. The laser treatment was performed in air in an effort to make the laser treatment as representative as possible of conventional environmental conditions in the semiconductor industry. The laser was an excimer pumped UV-dye laser having a wavelength of about 248 nm, a pulse duration of about 380 femtoseconds (fs), and an output energy of about 10 millijoules (mJ) per pulse, with a maximum pulse repetition rate of about 10 Hz. The energy density of the pulses was about 1.3 millijoules per square centimeter ($mJ/cm^2$).

The GaAs samples were treated with 250, 500 and 1000 laser pulses in order to investigate possible dose dependent effects, if any. About half of each sample was exposed within the cross-sectional area of the beam, while the other half was protected with a mask for use as a reference for comparing the treated and untreated areas.

The treated samples were then analyzed by scanning electron microscopy (SEM), x-ray photoelectron spectroscopy (XPS), atomic force microscopy (AFM), and thermally stimulated exoelectron emission spectroscopy (TSEE). The results are reported below.

Figure 1:
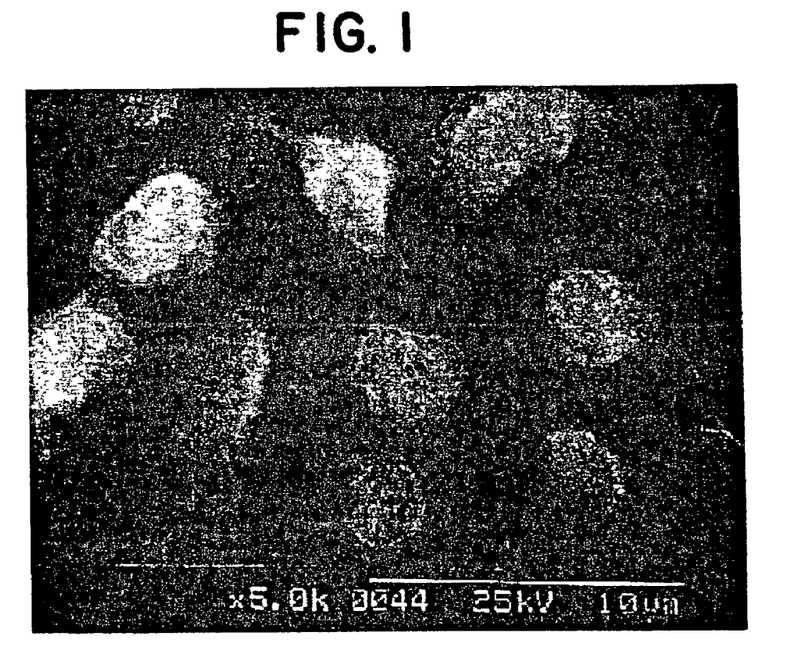
FIG. 1 shows a micrograph taken with a scanning electron microscope (SEM) of a passive surface of gallium arsenide prepared by the process of the invention.
Figure 2:
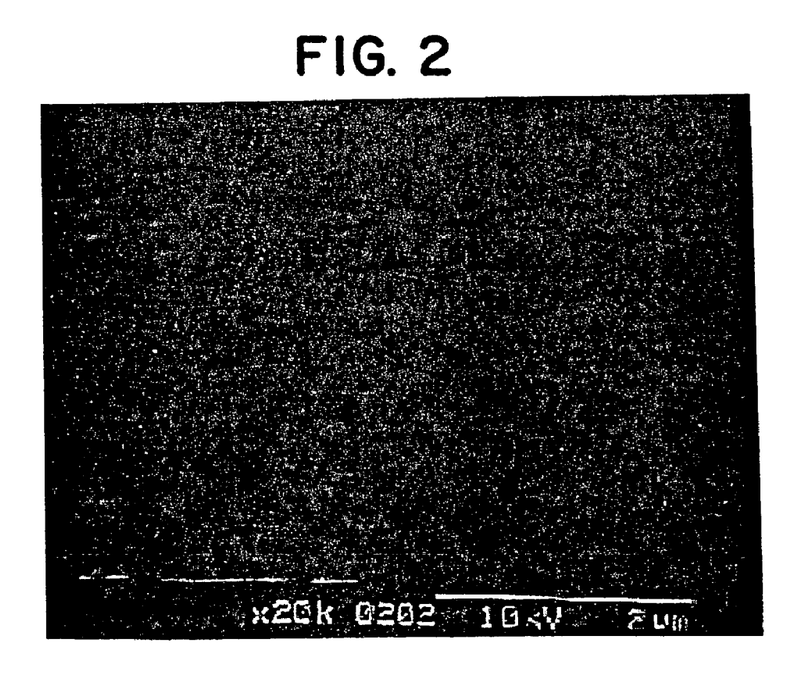
FIG. 2 is an SEM micrograph of a gallium arsenide passive surface at a somewhat higher magnification.

1.) Scanning Electron Microscopy (SEM) Measurements:

The treated samples of GaAs were observed using a scanning electron microscope (Hitachi, S2300). The observations were performed at a base pressure of about $10^{-4}$ torr. Images displayed on the microscope's display screen are captured with an inbuilt Polaroid camera. The images indicated the surface structural changes produced by the treatment. FIGS. 1 and 2 show the passivated surface of the GaAs sample after laser treatment, FIG. 1 shows the surface at a magnification of 2000×; FIG. 2 shows the surface at a magnification of 20,000×. The presence of small clusters almost uniformly over the treated surface is seen. The untreated surface did not exhibit such features.

2.) Atomic Force Microscopy (AFM) Measurements:

AFM measurements were performed on treated and untreated GaAs samples in order to observe the surface on an atomic level and to correlate the surface appearance with the observed passivation. The samples were imaged with a Nanoscope III (Digital Instruments) contact mode type of AFM under ambient conditions. A 200 μm triangularly shaped silicon nitride cantilever (with force constant k=0.12 $N \cdot m^{-1}$, from Digital Instruments) was chosen for imaging. The samples were secured on a steel disk with double sided tape, and the assembly was placed on a magnetically controlled scanner. Of particular interest in these measurements was the root-mean-square (rms) roughness of the treated and untreated samples, and their appearance.

Figure 3:
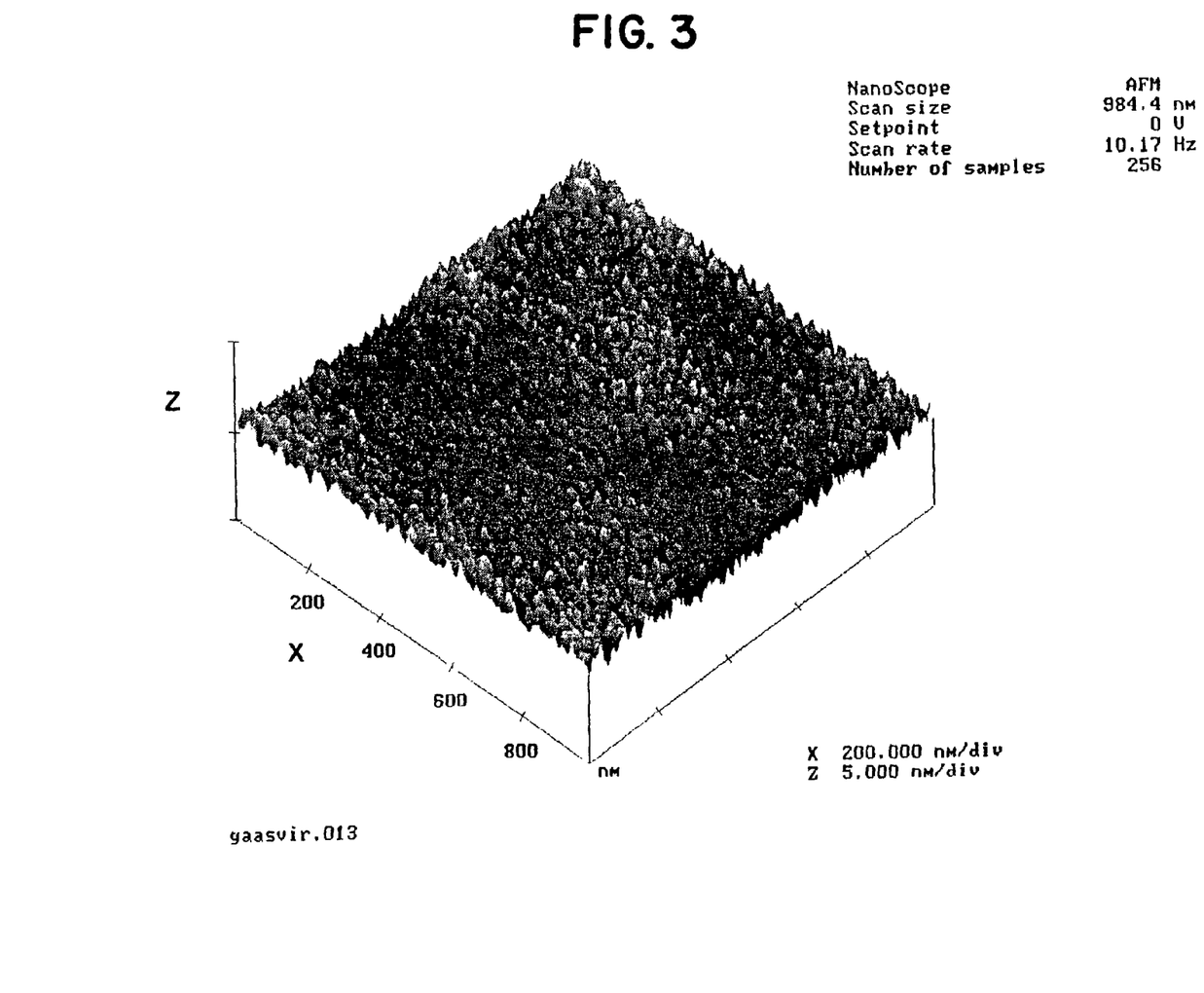
FIG. 3 is a micrograph taken with an atomic force microscope (AFM) showing a gallium arsenide surface before treatment by the process of the invention.
Figure 4:
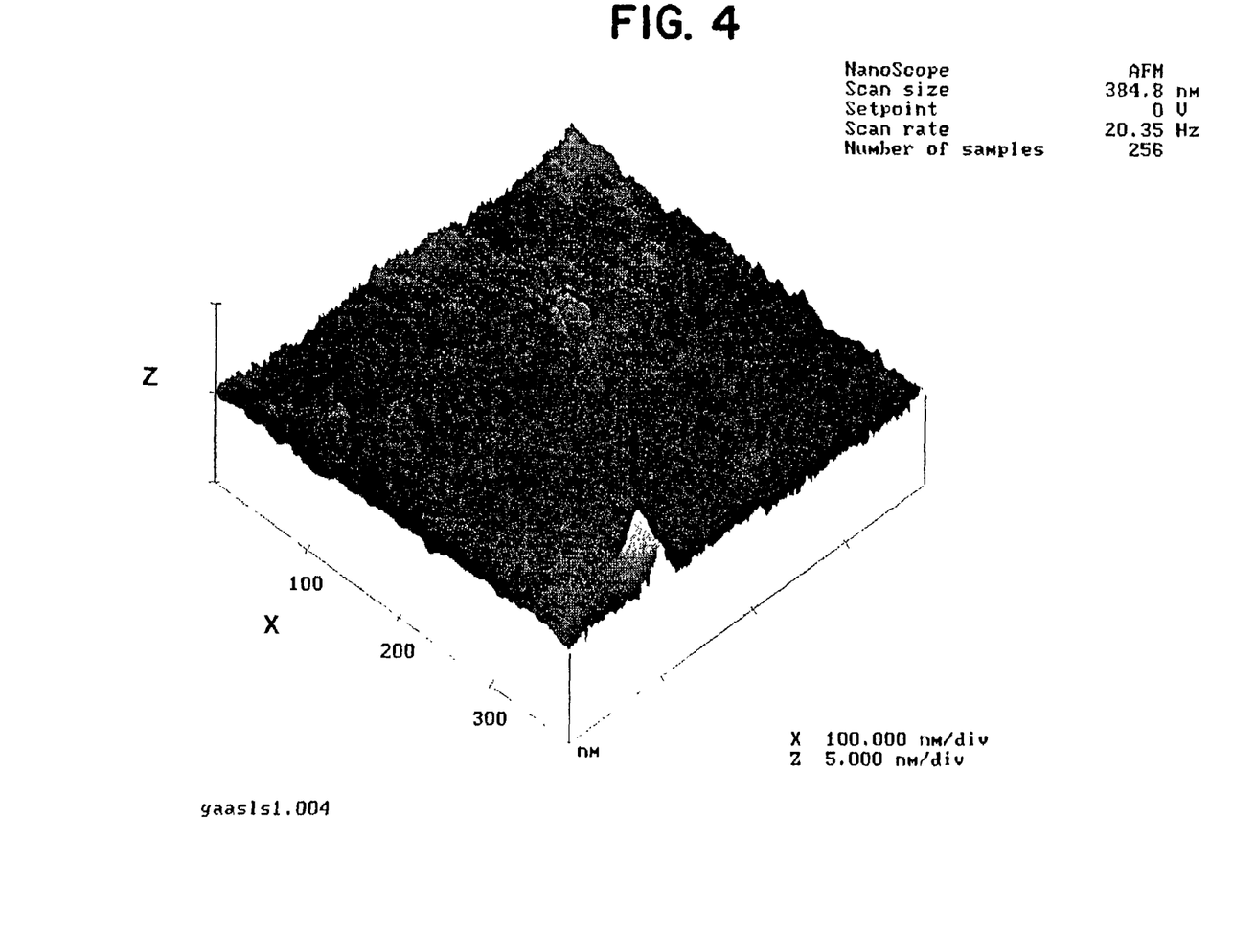
FIG. 4 is an AFM micrograph showing a gallium arsenide surface after treatment by the process of the invention.

A comparison between virgin and treated samples shows that the laser-treated samples exhibit features which indicate that atoms have agglomerated and formed clusters. This effect was most pronounced for samples treated with 500 and 1000 laser pulses. The root-mean-square (rms) roughness of the GaAs surface, as indicated by these AFM measurements, is 0.37 nm for a virgin sample and 4.2 nm for a treated sample. The increase in surface roughness, at an atomic level, by about an order of magnitude can be correlated with the formation of GaAs clusters on the surface. The difference between the untreated and treated surfaces can be seen in FIGS. 3 and 4, wherein FIG. 3 shows an untreated surface, and FIG. 4 shows a treated surface. The images in FIGS. 3 and 4 are presented in the conventional perspective views generated by the AFM. Note that the scanned areas and corresponding linear scales on the scanning axes are different for the two figures. FIG. 3 shows a scan area 984.4 nm per side and the linear scale of the X-axis is 200,000 nm/division (div). FIG. 4 shows a scan area 384.8 nm per side and the linear scale of the X-axis is 100,000 nm/division (div). The scale of the vertical axis (Z) is the same for both figures, i.e., 5,000 nm/div.

3.) Thermally Stimulated Exoelectron Emission (TSEE) Measurements:

The TSEE spectrometer consists of a stainless steel vacuum chamber pumped by rotary and oil diffusion pumps equipped with a liquid nitrogen cold-trap. The instrument contains a sample holder provided with an electrical resistance heater that simultaneously holds the sample and also provides the steadily increasing temperature (thermal ramp) that is required for TSEE measurements. The heating rate was set to 9K per minute, using a microprocessor controlled power supply. The emitted exoelectrons were detected with a channel electron multiplier (Galileo, CEM 4700) that is used in the pulsed mode of operation. Output of the electron multiplier is fed to the "Y" stage of and X-Y plotter (Philips, PM8132). Sample temperature is monitored by placing a chromel-alumel thermocouple in close proximity to the sample. The thermocouple output formed the "X" input to the X-Y plotter. The TSEE spectrum is thus a plot of emitted exoelectron intensity, as a function of sample temperature. The electronically active trapping centers are identified as peaks in the TSEE spectrum. The position of the peaks on the temperature axis is used to estimate the defect energy by the relation $$E_g = 25 \cdot k_b \cdot T_m \quad (1)$$

where $E_g$ is the activation energy of the trap created by a surface defect, $k_b$ is Boltzmann's constant, and $T_m$ is the temperature at the maximum of the peak in the TSEE spectrum due to electrons emitted from that defect.

Figure 5:
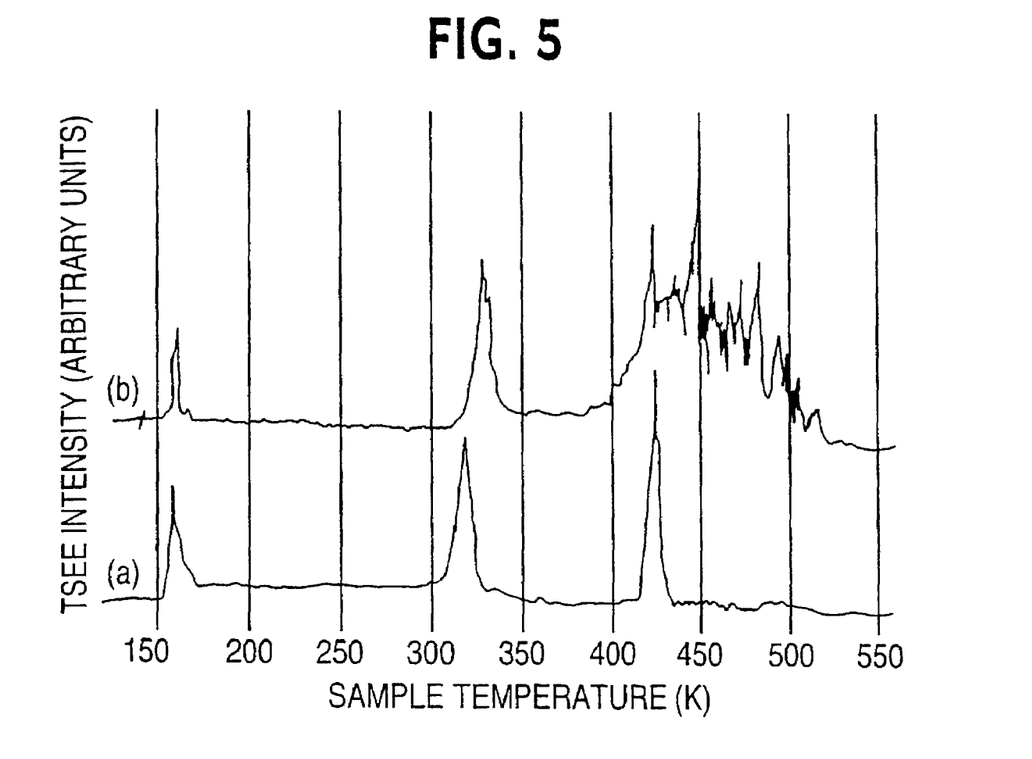
FIG. 5 shows the thermally stimulated exoelectron spectra of a GaAs surface before and after treatment by the process of the invention.

FIG. 5 shows the TSEE spectra of untreated (lower trace (a)) and treated (upper trace (b)) GaAs surfaces. The horizontal axis shows the sample temperature in Kelvins, while the vertical axis shows the intensity of thermally stimulated electron emission in arbitrary units. Table 1 compares the peak positions and corresponding peak energies for treated and untreated GaAs (n(100) surface). The spectra of the treated surfaces were identical, within experimental error, for samples treated with 250, 500 and 1000 laser pulses.

TABLE 1

| Untreated samples | | Treated Samples | |
|---|---|---|---|
| Peak Temperature (K.) | Trap Energy (eV) | Peak Temperature (K.) | Trap Energy (eV) |
| 165 | 0.356 | 162 | 0.349 |
| 325 | 0.701 | 325 | 0.701 |
| 432 | 0.932 | centered around 450 | centered around 0.970 |

It can be observed that the peaks at 165 K and 325 K in virgin GaAs are almost unaltered by the laser treatment. However, the single peak centered around 432 K in a virgin sample is seen to change to several small peaks, broaden considerably, and shift to a higher temperature following the femtosecond laser treatment. The shift toward higher temperatures is an indication of an increase in electronic activation energy, while the broadening as splitting of the single peak into multiple peaks suggests the presence of several energy levels within a narrow energy interval, possible due to the formation of small GaAs clusters on the surface. Shifting of the center of the peak to higher temperatures indicates the presence of higher activation energy for the defects at the surface as a consequence of the laser treatment. Since the laser treatment was performed in air, a reasonable explanation for this observation is the formation of an oxide layer on the surface. However, based on the TSEE measurements that were performed as function of time, the treated surface appears to be chemically stable, as though it were passivated. To investigate the validity of these deductions x-ray photoelectron spectroscopy (XPS) measurements were performed.

4. X-ray Photoelectron Spectroscopy (XPS) Measurements:

X-ray Photoelectron Spectroscopy (XPS) measurements were performed to investigate the surface chemistry of the femtosecond laser-treated samples and to correlate the results with SEM observations and TSEE measurements. The XPS spectrometer used also was equipped with an integral argon-ion gun that enables in-situ etching of the sample to permit the study of the composition of the substrate at short distances below the original surface. The XPS spectrometer, manufactured by Kratos Analytical, has a sample transfer chamber that is isolated from the measurement chamber by means of a gate valve. The sample is transferred to the measurement chamber by a sample translator stage within the instrument.

The instrument can be adjusted to excite electrons from preselected orbitals of the atoms in the surface under investigation. The results of the measurements are shown in FIGS. 6A–6D, 7A–7D, and 8–11. These figures illustrate the intensity of photoelectron emission for orbitals of different binding energy. The horizontal axis shows the binding energy in electron volts (eV), while the vertical axis shows the intensity of the electron emission in counts registered by the XPS spectrometer.

Figure 6A:
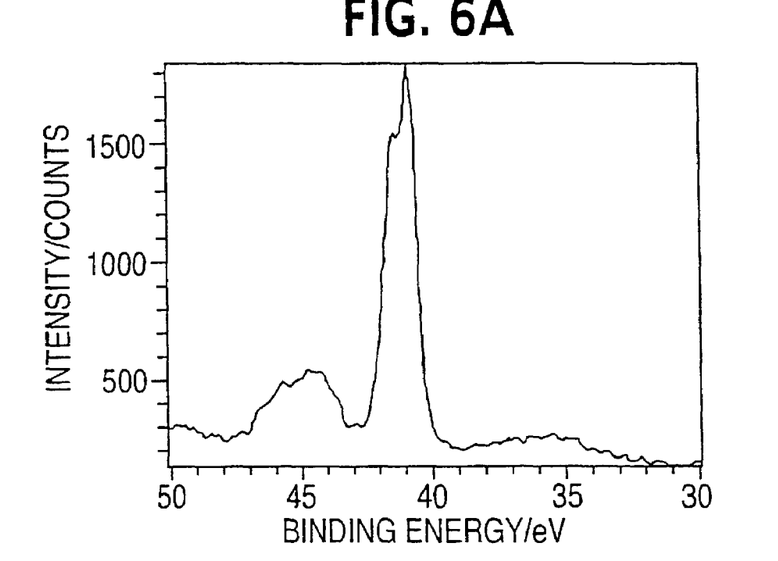
FIGS. 6A–6D show x-ray photoelectron spectra of a GaAs surface before treatment with ultra-short laser pulses according to the invention, for As atoms located at the surface and at depths of 5 nm, 10 nm and 15 nm below the surface, respectively.
Figure 6B:
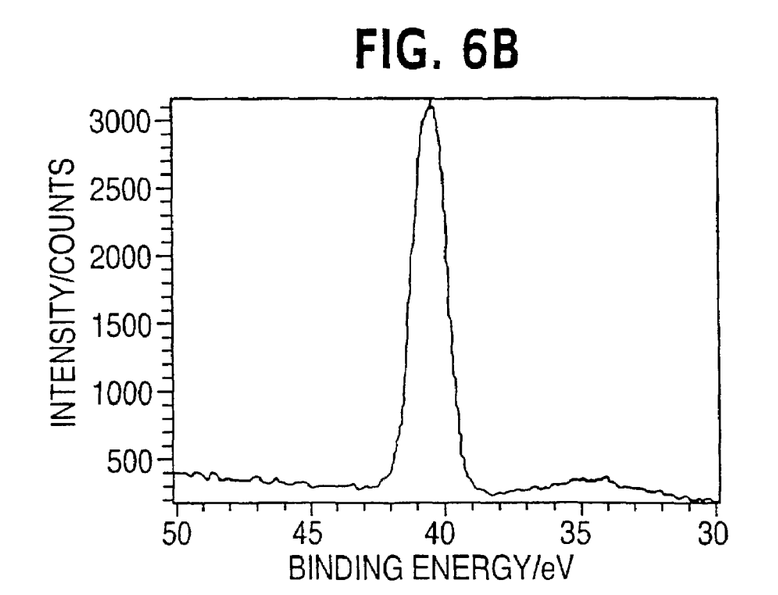
Figure 6C:
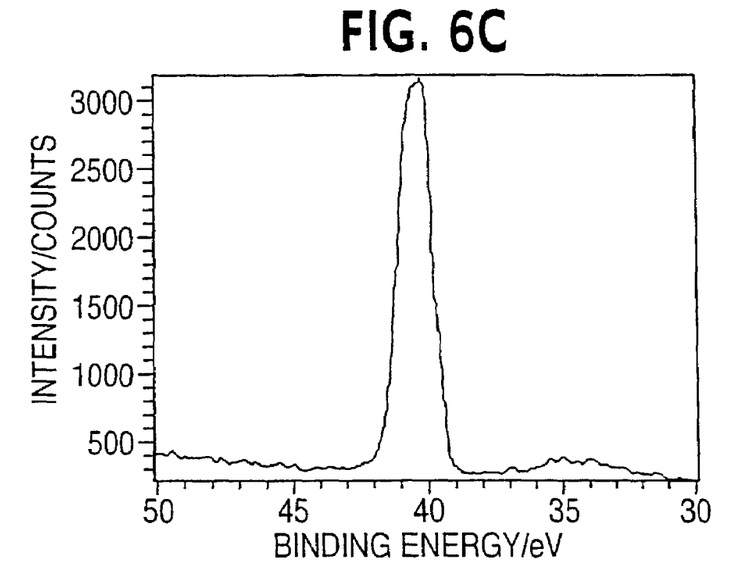
Figure 6D:
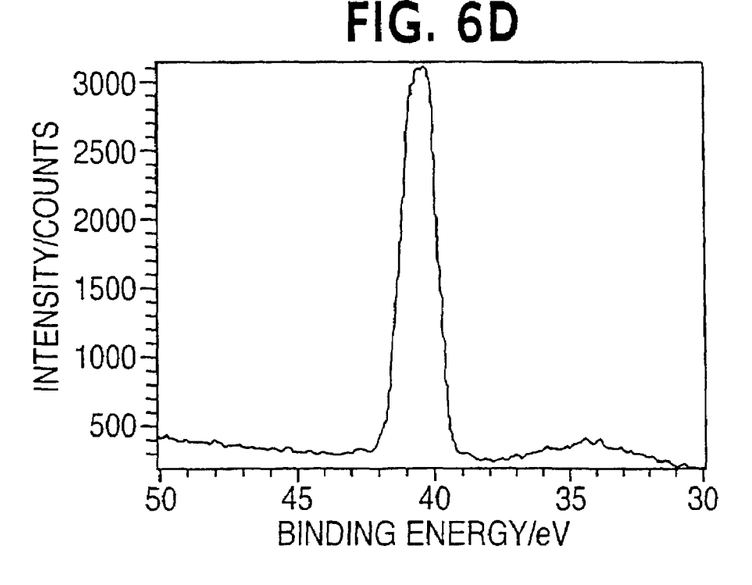
Figure 7A:
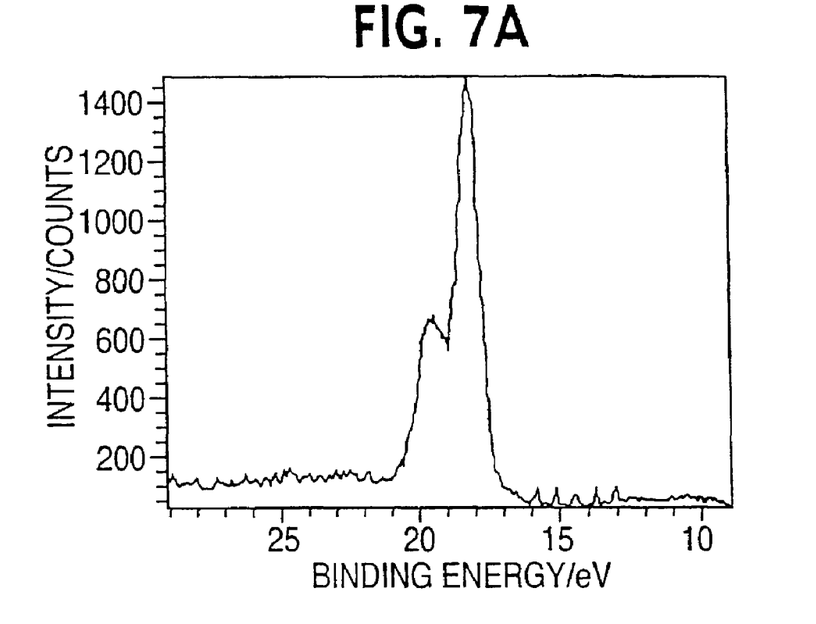
FIGS. 7A–7D show x-ray photoelectron spectra of a GaAs surface before treatment with ultra-short laser pulses according to the invention, for Ga atoms located at the surface and at depths of 5 nm, 10 nm and 15 nm below the surface, respectively.
Figure 7B:
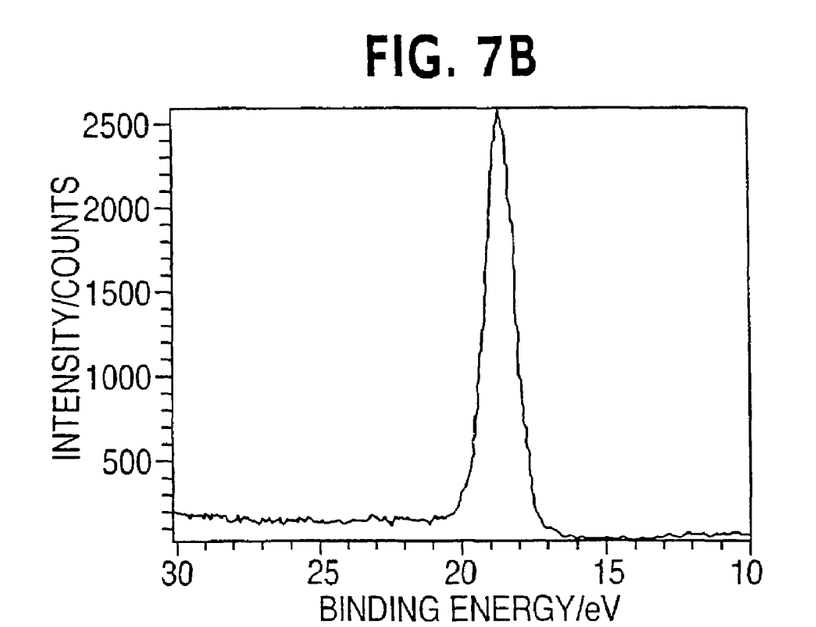
Figure 7C:
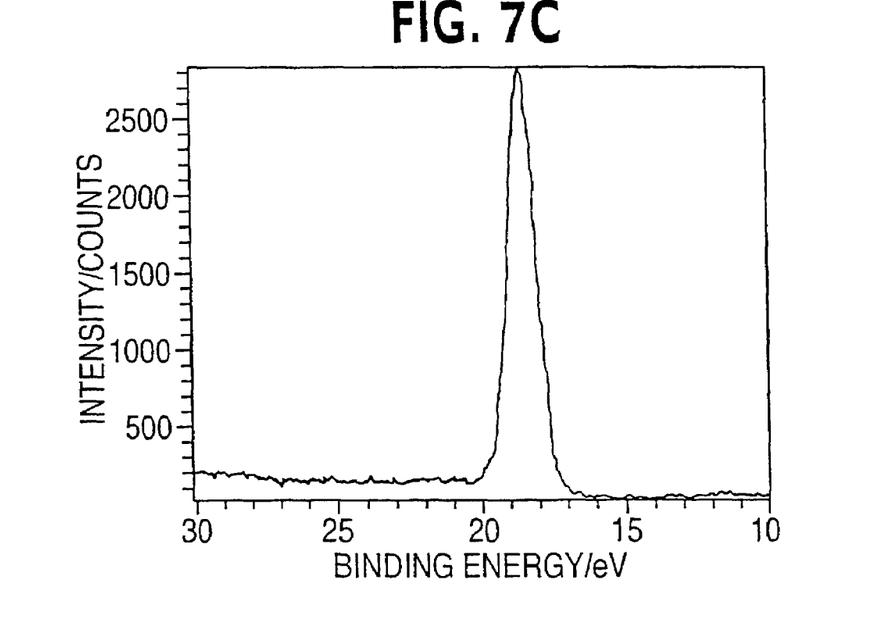
Figure 7D:
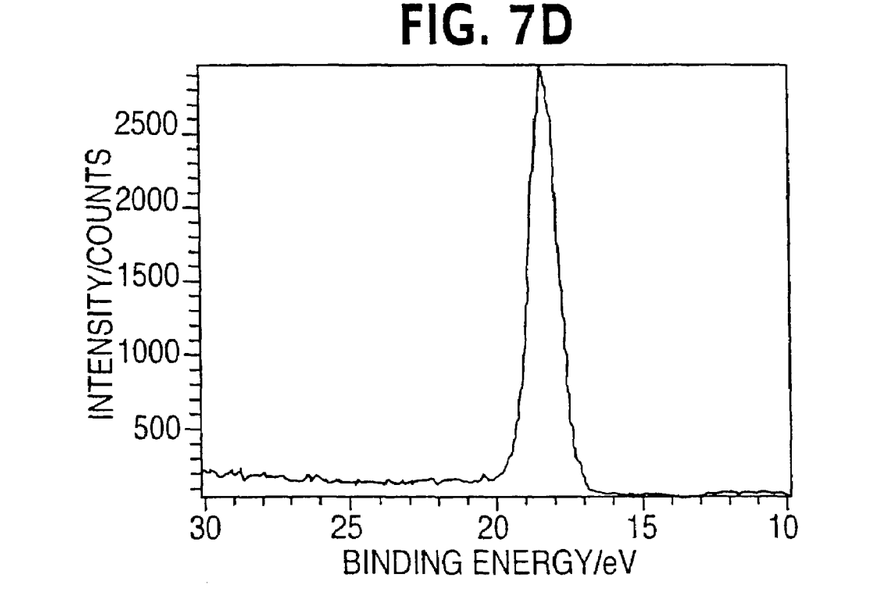

FIGS. 6A–6D and 7A–7D show the spectral lines recorded for As 3d electrons and Ga 3d electrons, respectively, at depths of 0 nm, 5 nm, 10 nm and 15 nm, for untreated GaAs. The peaks at 45 eV, as seen in FIG. 6A and at 20 eV, as seen in FIG. 7A indicate the oxides of gallium and arsenic, respectively. As seen from the series of spectra, the oxide peaks disappear after the first milling operation. Thus, there is no oxide below the surface of the substrate.

Figure 8:
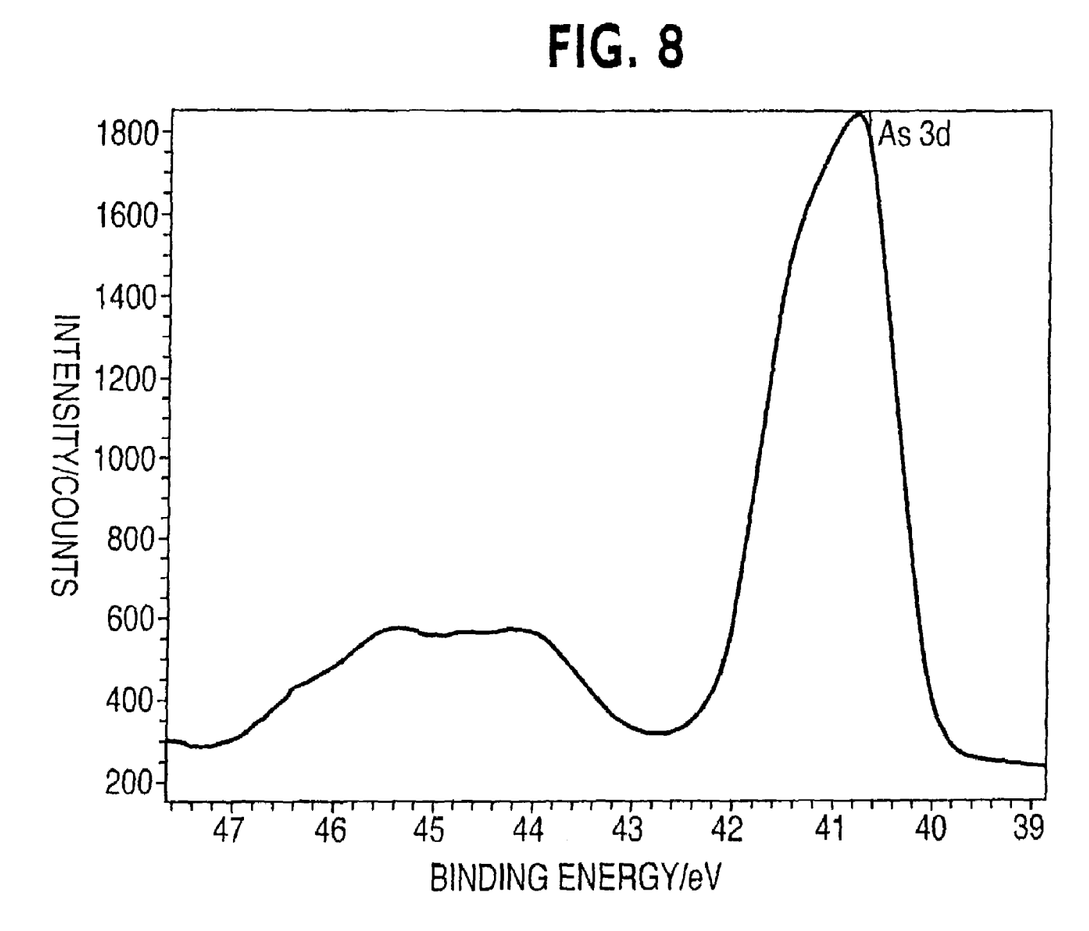
FIG. 8 shows the x-ray photoelectron spectra of a GaAs surface after treatment with 250 ultra-short laser pulses according to the invention, for As atoms located at the surface of the material.
Figure 9:
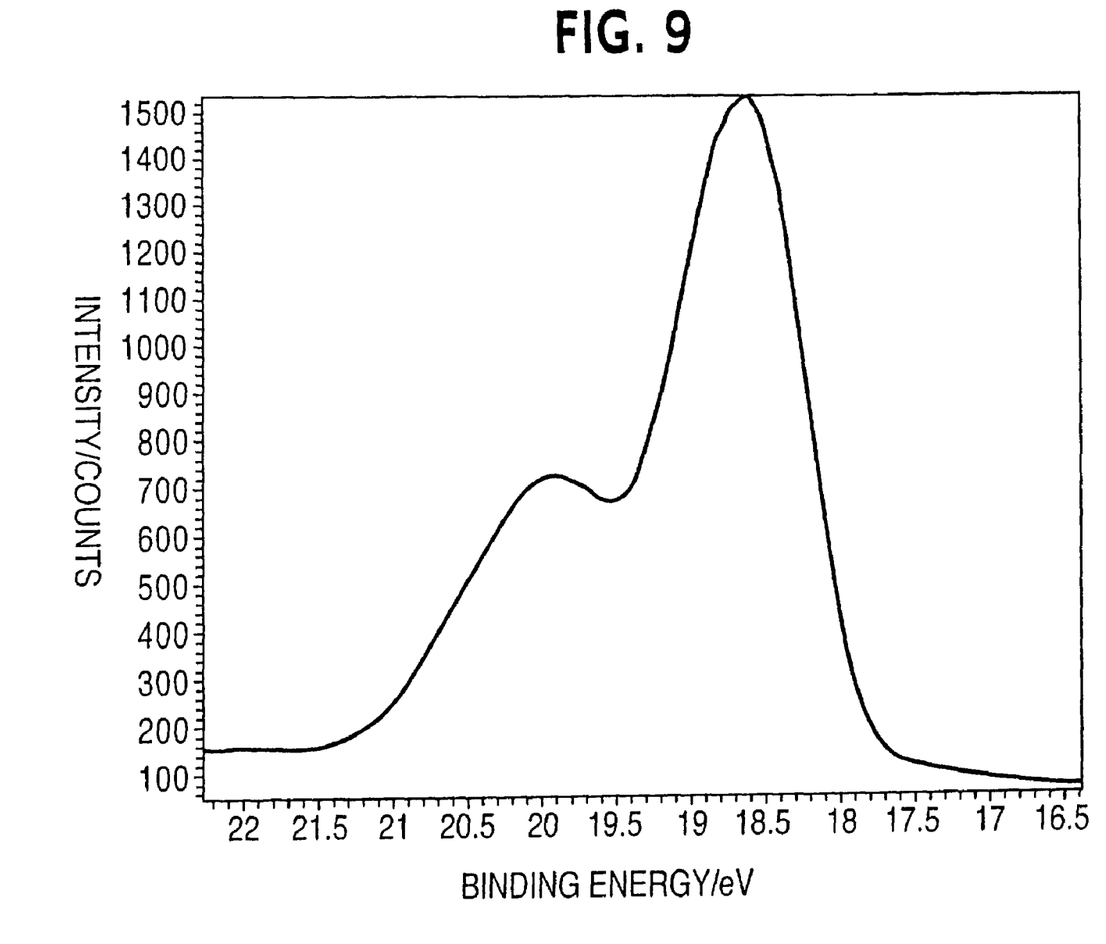
FIG. 9 shows the x-ray photoelectron spectra of a GaAs surface after treatment with 250 ultra-short laser pulses according to the invention, for Ga atoms located at the surface of the material.
Figure 10:
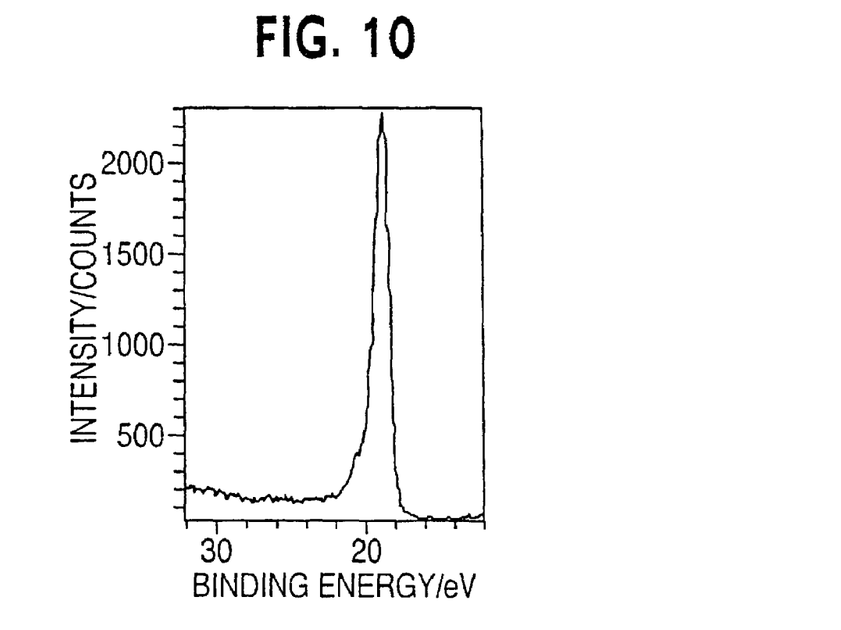
FIG. 10 shows the x-ray photoelectron spectra of a GaAs surface after treatment with 500 ultra-short laser pulses according to the invention, for Ga atoms located at the surface of the material.
Figure 11:
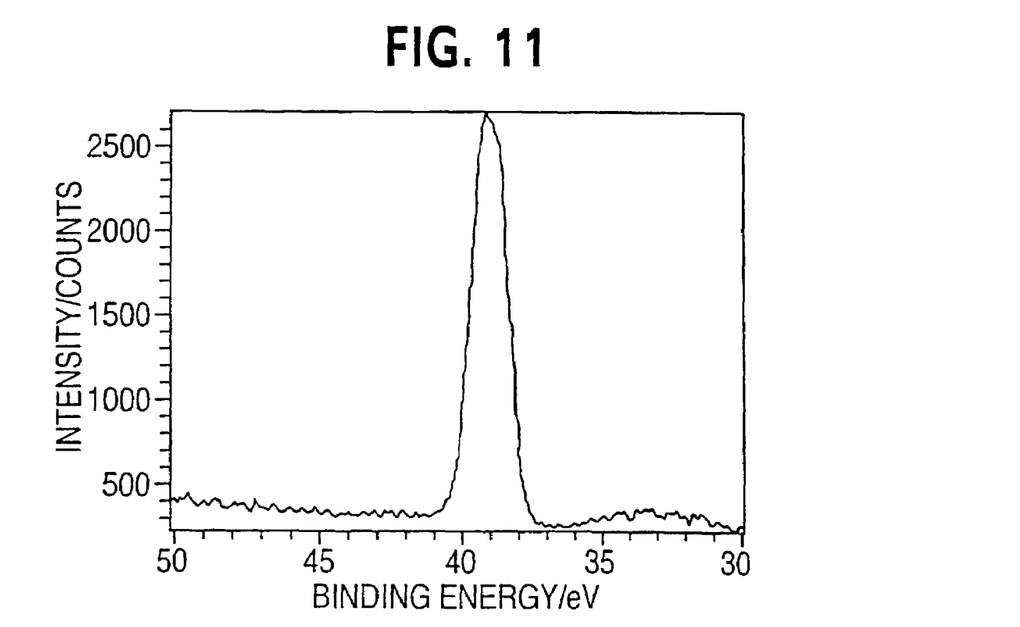
FIG. 11 shows the x-ray photoelectron spectra of a GaAs surface after treatment with 500 ultra-short laser pulses according to the invention, for As atoms located at the surface of the material.

FIGS. 8 and 9 show the XPS spectra of As 3d and Ga 3d, respectively, of the surface of a sample treated with 250 laser pulses. The presence of oxides of both Ga and As is clearly seen. However, for samples treated with 500 pulses, no oxide of either Ga or As is detected on the surface. (See FIGS. 10 and 11, respectively.) Furthermore, repeated analyses of the treated surface after exposure to ambient atmosphere for intervals of up to one month detected no oxide formation. Oxide normally forms on a GaAs surface within a few minutes of exposure to atmospheric air. Consequently, these results establish that the surface of the GaAs substrate has been rendered passive to atmospheric oxygen by the femtosecond-laser treatment of the invention. The same results were obtained for samples treated with 1000 pulses of laser radiation at the same energy density. The sample surfaces treated with only 250 pulses at an energy density of 1.3 mJ/cm$^2$ exhibited the presence of some residual oxide.

The results of these experiments suggest that surface treatment of a GaAs surface with ultra-short pulses of electromagnetic radiation, such as that provided by a pulsed femtosecond laser, produces a surface that does not react with atmospheric oxygen at room temperature and is characterized by the formation of clusters over the surface and the presence of surface defects associated with the clusters.

Although applicants are not bound by theoretical considerations, they believe that the data reported above permit certain conclusions regarding the structure of the passive surface produced by the process of the invention and the mechanism by which such a surface is produced. It should be noticed that the SEM data (FIGS. 1 and 2) indicate surface features having a size on the order of 1–2 μm, which can be interpreted as clusters of atoms ("microclusters"). The AFM data (FIGS. 3 and 4) display the structure of the surface on a much smaller scale, i.e., the entire scan area of the AFM instrument covers an area of about 1 μm square (FIG. 3) or 0.4 μm square (FIG. 4). Consequently, the AFM data relate to the surface of a single one of the micro-clusters seen in the SEM images. Thus, the AFM data show a coarseness of about 4.2 nm, and the clusters having dimensions of this order of magnitude, e.g., 1–10 nm, may be referred to as "nanoclusters".

Inasmuch as the treatment using an ultra-short pulsed laser (femtosecond laser) deposits substantially the entire energy of a pulse at the actual surface of the substrate material in a time that is short relative to the vibrations of the atoms in the surface, the generation of thermal phonons that will dissipate the energy into the bulk material does not occur. Consequently, the subsurface atoms are essentially not heated in such a treatment, and, accordingly, the heat affected zone (HAZ) in the femtosecond laser-treated material is practically absent. The result is that the gallium and arsenic atoms do not have time to rearrange by diffusion. Hence the stoichiometry as well as the relative percentage of Ga and As does not change in the treated GaAs surface. Thus, when a fresh surface is created by laser ablation of a superficial oxide layer, it may be expected to have dangling or unsaturated bonds only at the external, or "upper", side of the substrate. In order to reduce the surface energy, it appears that the some migration of atoms can occur along the surface to form clusters having bonds arranged in closed loops. These clusters would not have unsaturated bonds, and hence there is no chemical affinity or reactivity at the processed surface. Thus, a non-reactive or "passive" surface is generated. Since the GaAs stoichiometry is maintained, the bonds do not experience any excessive stress and remain stable for an extended period of time. It is believed that such a surface exhibiting clustering at the atomic level, i.e., nanoclusters, results from the reduction of surface energy at the fresh surface created by removal of native oxide. This reduced surface energy is responsible for the passivated behavior of the GaAs surface. Consequently, the surface exhibiting atomic nanoclusters is correlated with the passive property that is produced by the laser treatment according to the invention.

The larger features (microclusters) seen in the AFM images may be formed because the ultra-short laser pulse generates a plasma in the air adjacent to the surface that lasts longer than the pulse itself. Thus, although the subsurface atoms are not heated by the laser pulse, as explained above, the atoms at the exact surface may acquire enough energy from such a plasma to undergo a superficial melting and subsequent resolidification, with formation of the somewhat coarser clustering seen in the SEM images.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method of passivating the surface of a solid material, comprising irradiating the surface of a solid material with a pulsed laser beam having a pulse duration no longer than the atomic vibration period of the solid material.

2. The method of claim 1, wherein said solid material is a semiconductor.

3. The method of claim 1, wherein said solid material is a compound semiconductor.

4. The method of claim 1, wherein said solid material is a III–V compound semiconductor.

5. The method of claim 1, wherein said solid material is gallium arsenide.

6. The method of claim 1, wherein said laser emits radiation in a wavelength range from about 2 micrometers to about 50 nanometers.

7. A method of passivating the surface of a solid material, comprising irradiating the surface of a solid material with a pulsed laser beam having a pulse duration not greater than about $10^{-11}$ seconds.

8. The method of any one of claims 1–7, wherein said pulses have a duration not greater than about $10^{-12}$ seconds.

9. The method of claim 8, wherein said pulses have a duration not greater than about $0.5 \times 10^{-12}$ seconds.

10. The method of any one of claims 1–7, wherein said pulses have an energy density in the range from about 0.01 mJ/cm$^2$ to about 100 mJ/cm$^2$.

11. An article comprising a solid material having a surface passivated by the method according to any of claims 1–7.

12. An article comprising a solid semiconductor having a passive surface including nanoclusters of constituent atoms of said semiconductor.

13. An article according to claim 12, wherein said semiconductor is a compound semiconductor.

14. An article according to claim 12, wherein said semiconductor is a III–V compound semiconductor.

15. An article according to claim 12, wherein said semiconductor is gallium arsenide.

* * * * *